United States Patent
Reid et al.

(10) Patent No.: US 7,816,278 B2
(45) Date of Patent: Oct. 19, 2010

(54) IN-SITU HYBRID DEPOSITION OF HIGH DIELECTRIC CONSTANT FILMS USING ATOMIC LAYER DEPOSITION AND CHEMICAL VAPOR DEPOSITION

(75) Inventors: Kimberly G. Reid, Austin, TX (US); Anthony Dip, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 183 days.

(21) Appl. No.: 12/058,470

(22) Filed: Mar. 28, 2008

(65) Prior Publication Data

US 2009/0246971 A1    Oct. 1, 2009

(51) Int. Cl.
*H01L 21/33* (2006.01)
(52) U.S. Cl. .................... 438/758; 438/762; 438/681; 438/763; 438/E21.274
(58) Field of Classification Search ......... 438/681–689, 438/758, 763
See application file for complete search history.

(56) References Cited

U.S. PATENT DOCUMENTS

| | | | |
|---|---|---|---|
| 6,042,652 A | 3/2000 | Hyun et al. |
| 6,143,659 A | 11/2000 | Leem |
| 6,174,377 B1 | 1/2001 | Doering |
| 6,287,965 B1 | 9/2001 | Kang et al. |
| 6,346,477 B1 | 2/2002 | Kaloyeros |
| 6,420,279 B1 | 7/2002 | Ono et al. |
| 6,465,371 B2 | 10/2002 | Lim |
| 6,475,276 B1 | 11/2002 | Elers et al. |
| 6,548,424 B2 | 4/2003 | Putkonen |
| 6,572,705 B1 | 6/2003 | Suntola et al. |
| 6,607,973 B1 | 8/2003 | Jeon |
| 6,790,755 B2 | 9/2004 | Jeon |
| 6,818,517 B1 | 11/2004 | Maes |

(Continued)

FOREIGN PATENT DOCUMENTS

EP      1205 574 A2      5/2002

(Continued)

OTHER PUBLICATIONS

Kawahara et al., Effects of Hf Sources, Oxidizing Agents, and NH3 Radicals on Properties of HfAlOx Films Prepared by Atomic Layer Deposition, IWGI, 2003, pp. 32-37, Piscataway, NJ.

(Continued)

*Primary Examiner*—Dung A. Le

(57) ABSTRACT

An in-situ hybrid film deposition method for forming a high-k dielectric film on a plurality of substrates in a batch processing system. The method includes loading the plurality of substrates into a process chamber of the batch processing system, depositing by atomic layer deposition (ALD) a first portion of a high-k dielectric film on the plurality of substrates, after depositing the first portion, and without removing the plurality of substrates from the process chamber, depositing by chemical vapor deposition (CVD) a second portion of the high-k dielectric film on the first portion, and removing the plurality of substrates from the process chamber. The method can further include alternatingly repeating the deposition of the first and second portions until the high-k dielectric film has a desired thickness. The method can still further include pre-treating the substrates and post-treating the high-k dielectric film in-situ prior to the removing.

19 Claims, 6 Drawing Sheets

U.S. PATENT DOCUMENTS

| | | |
|---|---|---|
| 6,858,547 B2 | 2/2005 | Metzner et al. |
| 6,884,685 B2 | 4/2005 | Luo et al. |
| 6,900,455 B2 | 5/2005 | Drewes |
| 6,946,336 B2 | 9/2005 | Pang et al. |
| 2001/0054769 A1 | 12/2001 | Raaijmakers |
| 2002/0157611 A1 | 10/2002 | Bondestam et al. |
| 2002/0182320 A1 | 12/2002 | Leskela et al. |
| 2002/0197863 A1 | 12/2002 | Mak et al. |
| 2003/0013320 A1 | 1/2003 | Kim et al. |
| 2003/0031793 A1 | 2/2003 | Chang |
| 2003/0049372 A1 | 3/2003 | Cook et al. |
| 2003/0134038 A1 | 7/2003 | Paranjpe |
| 2003/0176060 A1 | 9/2003 | Doan et al. |
| 2003/0232506 A1 | 12/2003 | Metzner et al. |
| 2004/0033661 A1 | 2/2004 | Yeo et al. |
| 2004/0043149 A1 | 3/2004 | Gordon et al. |
| 2004/0065258 A1 | 4/2004 | Sandhu et al. |
| 2004/0161899 A1 | 8/2004 | Luo et al. |
| 2004/0198069 A1 | 10/2004 | Metzner et al. |
| 2004/0211357 A1 | 10/2004 | Gadgil et al. |
| 2005/0056219 A1 | 3/2005 | Dip et al. |
| 2005/0136618 A1 | 6/2005 | Lee et al. |
| 2006/0133955 A1 | 6/2006 | Peters |
| 2006/0156979 A1 | 7/2006 | Thakur et al. |
| 2006/0281264 A1* | 12/2006 | Hayashi et al. ............. 438/287 |
| 2007/0218623 A1* | 9/2007 | Chua et al. ................. 438/240 |
| 2007/0259534 A1 | 11/2007 | Reid et al. |

FOREIGN PATENT DOCUMENTS

| | | |
|---|---|---|
| JP | 10-50609 A | 2/1998 |
| WO | WO 03/035926 A2 | 5/2003 |
| WO | 2005050715 A2 | 6/2005 |
| WO | 2005113855 A1 | 12/2005 |

OTHER PUBLICATIONS

European Patent Office, International Search Report and Written Opinion of the International Searching Authority in application PCT/US2006/030735 corresponding to U.S. Appl. No. 11/462,234, dated Jan. 4, 2007, 11pp.

United States Patent and Trademark Office, Non-final Office Action issued on May 1, 2007 in related case U.S. Appl. No. 11/462,234, 21 pp.

* cited by examiner

IN-SITU HYBRID DEPOSITION OF HIGH DIELECTRIC CONSTANT FILMS USING ATOMIC LAYER DEPOSITION AND CHEMICAL VAPOR DEPOSITION

CROSS-REFERENCE TO RELATED APPLICATIONS

The present invention is related to U.S. patent application Ser. No. 11/462,234, filed Aug. 3, 2006 and entitled IN-SITU ATOMIC LAYER DEPOSITION. The entire content of this application is incorporated herein by reference.

FIELD OF THE INVENTION

This invention relates to deposition of high dielectric constant (high-k) dielectric films for microelectronic devices, and more particularly to an in-situ hybrid deposition of high-k dielectric films using a combination of atomic layer deposition (ALD) and chemical vapor deposition (CVD).

BACKGROUND OF THE INVENTION

In the semiconductor industry, the minimum feature sizes of microelectronic devices are well into the deep sub-micron regime to meet the demand for faster, and lower power semiconductor devices. The downscaling of complimentary metal-oxide-semiconductor (CMOS) devices imposes scaling constraints on the gate dielectric material. The thickness of the conventional $SiO_2$ gate dielectric is approaching its physical limits. The most advanced devices are using nitrided $SiO_2$ gate dielectrics approaching an equivalent oxide thickness (EOT) of about 1 nanometer (nm) or less where the leakage current density can be as much as 1 $mA/cm^2$. To improve device reliability and reduce electrical leakage from the gate dielectric to the transistor channel during operation of the device, semiconductor transistor technology is implementing the use of high-k gate dielectric materials that allow increased physical thickness of the gate dielectric layer while maintaining a low EOT. EOT is defined as the thickness of $SiO_2$ that would produce the same capacitance voltage curve as that obtained from an alternate dielectric material. High-k materials are dielectric materials featuring a dielectric constant greater than that of $SiO_2$ (k~3.9). High-k materials may refer to dielectric materials that are deposited onto substrates rather than grown on the surface of the substrate, as is the case for $SiO_2$. High-k materials may, for example, include a metal oxide film or a metal silicate film.

Several methods have been developed for forming thin high-k dielectric films that may be used in semiconductor devices. Among the more established techniques are Chemical Vapor Deposition (CVD) and Atomic Layer Deposition (ALD), but these deposition techniques each have advantages and disadvantages that are problematic for high-volume semiconductor manufacturing. In addition to the need to reduce substrate (wafer) contamination, there is further a need to achieve good uniformity in batch processing, with respect to zone-to-zone uniformity, wafer-to-wafer uniformity and overall film uniformity. In addition to the need for good film uniformity, there is also a need to improve the electrical properties of the high-k dielectric film, including the amount of hysteresis in the film, the density of defects at interfaces of the high-k dielectric film with other materials, and the leakage current, while maintaining a high effective k value for the film stack and a low EOT.

SUMMARY OF THE INVENTION

Embodiments of the invention provide a method for in-situ hybrid deposition of a high-k dielectric film on a plurality of substrates for high-volume semiconductor manufacturing. The method includes sequential deposition of the high-k dielectric film using atomic layer deposition (ALD) and chemical vapor deposition (CVD). The portion of the high-k dielectric film deposited by ALD forms an excellent interface with the underlying substrate or an interface layer on the substrate, and the portion of the high-k dielectric film deposited by CVD uses the benefit of the higher deposition rate of CVD to provide cost-effective formation of a high-quality high-k dielectric film. Furthermore, the batch processing system is capable of fast temperature ramping (lowering or raising) over a large temperature range, thereby enabling the deposition of the first and second portions to be performed at different substrate temperatures.

According to one embodiment of the invention, the method includes loading a plurality of substrates into a process chamber of a batch processing system; depositing a first portion of a high-k dielectric film on the plurality of substrates by atomic layer deposition (ALD); after depositing the first portion, and without removing the plurality of substrates from the process chamber, depositing a second portion of the high-k dielectric film on the first portion by chemical vapor deposition (CVD); and removing the plurality of substrates from the process chamber. The method can further include pre-treating the substrates and post-treating the high-k dielectric films in-situ prior to the removing.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Figure 1A:
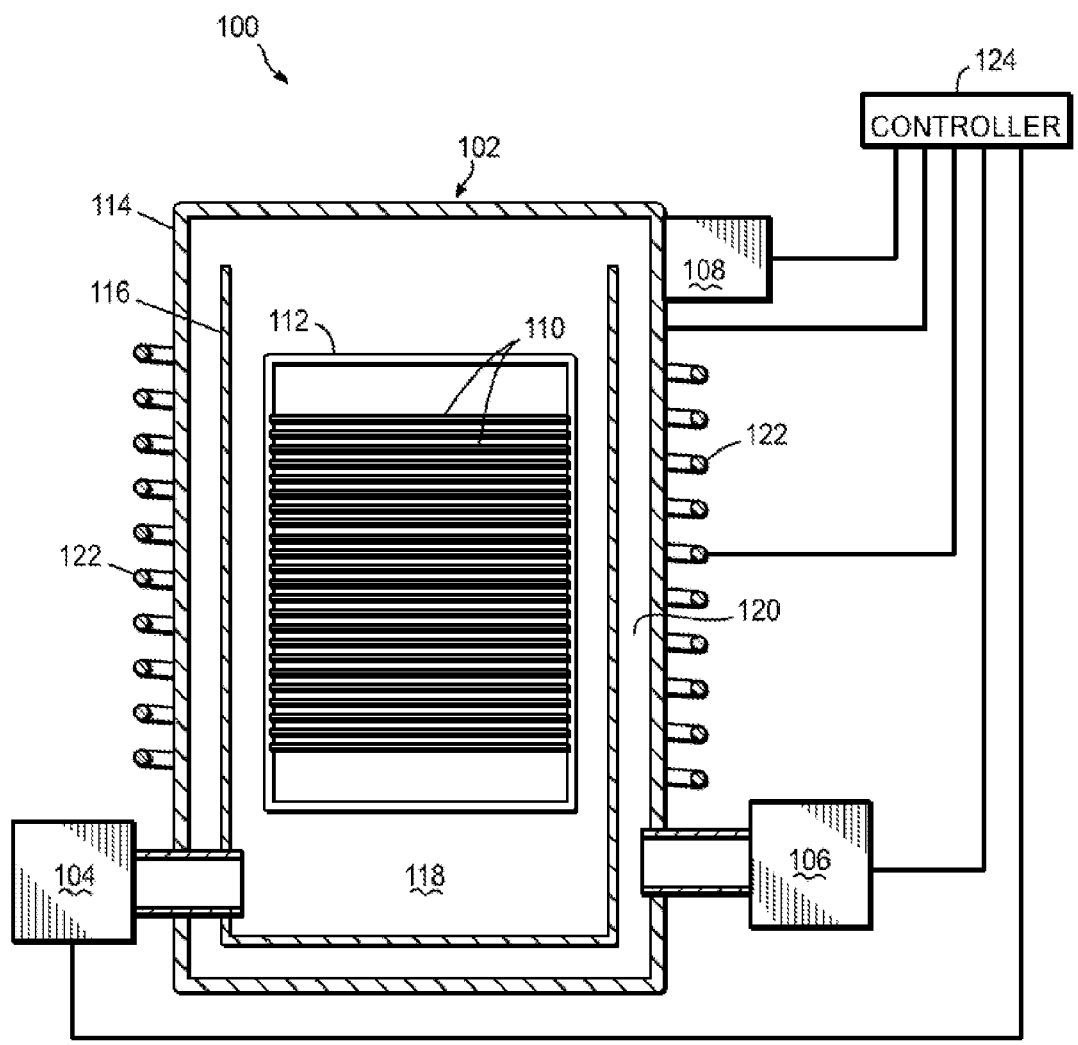
FIG. 1A shows a simplified block diagram of a batch processing system according to an embodiment of the invention.

Several methods have previously been developed for creating thin high-k dielectric films on substrates used in manufacturing semiconductor devices. Among the more established techniques is CVD. ALD, a variant of CVD, is a relatively newer technology now emerging as a potentially superior method of achieving uniform, conformal film deposition. ALD is a slower deposition method than CVD due to lower film deposition rates. However, ALD often provides superior high-k dielectric film properties such as better film conformality over high-aspect-ratio features such as trenches or vias commonly found in semiconductor devices, and reduced leakage currents due at least in part to better interfaces between the high-k dielectric film and underlying substrate and/or other films. Many uses of high-k dielectric films in semiconductor devices require film thicknesses that make ALD very time consuming due to the low film deposition rate and ALD can therefore be prohibitively expensive to perform. Furthermore, CVD processes, although being faster deposition processes, may not provide satisfactory high-k dielectric films due to inadequate film conformality and the inability to form good interfaces with an underlying substrate or/other films.

Embodiments of the invention provide a method for in-situ hybrid deposition of a high-k dielectric film on a plurality of substrates using one or more alternating sequences of ALD and CVD in a batch processing system. According to some embodiments of the invention, the high-k dielectric film can include metal oxides, metal oxynitrides, metal silicates, or metal silicon oxynitrides, or a combination thereof. The high-k dielectric film may also contain impurities, for example carbon or a halogen. The high-k dielectric film can, for example, contain a hafnium-containing film (e.g., $HfO_2$, HfON, HfSiO, or HfSiON), a zirconium-containing film (e.g., $ZrO_2$, ZrON, ZrSiO, or ZrSiON), a tantalum-containing film (e.g., $Ta_2O_5$), a titanium-containing film (e.g., $TiO_2$), or an aluminum-containing film (e.g., $Al_2O_3$), or a combination of two or more thereof. The high-k dielectric film may, for example, be utilized in a deep trench capacitor or as a part of a gate dielectric film in a transistor structure.

One skilled in the relevant art will recognize that the various embodiments may be practiced without one or more of the specific details, or with other replacement and/or additional methods, materials, or components. In other instances, well-known structures or operations are not shown or described in detail to avoid obscuring aspects of various embodiments of the invention. Similarly, for purposes of explanation, specific numbers, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

According to one embodiment of the invention, a method of forming a high-k dielectric film includes first loading a plurality of substrates (wafers) into a process chamber (e.g., process tube) of a batch processing system, depositing a first portion of a high-k dielectric film on the plurality of substrates by ALD, and thereafter depositing a second portion of the high-k dielectric film on the first portion by CVD. According to embodiments of the invention, the entire in-situ hybrid (ALD followed by CVD) high-k dielectric film deposition process is performed without removing the substrates from the process chamber. This prevents or at least significantly reduces incorporation of many common contaminants (e.g., organic materials present in air) into the high-k dielectric film and provides excellent control over the material and electrical properties of the high-k dielectric film.

According to other embodiments of the invention, the in-situ hybrid high-k dielectric film deposition process may further include pre-treating the substrate prior to depositing the high-k dielectric film on the substrate, post-treating the high-k dielectric film after deposition, or both pre-treating the substrate prior to the deposition of the high-k dielectric film and post-treating the high-k dielectric film after the deposition. The pre-treating may be performed to remove impurities from a surface of the substrate and/or to form an oxide or oxynitride interface layer on the substrate. The post-treating may be performed to densify and/or remove unreacted reactants from the high-k dielectric film, further form or oxidize the interface layer, or fill oxygen vacancies and or redistribute substitutional oxygen in the high-k dielectric film.

FIG. 1A shows a simplified block diagram of a batch processing system for forming a high-k dielectric film on a substrate according to an embodiment of the invention. The batch processing system 100 includes a process chamber 102, a gas injection system 104, a heater 122, a vacuum pumping system 106, a process monitoring system 108, and a controller 124. Multiple substrates 110 can be loaded into the process chamber 102 and processed using substrate holder 112, also referred to as a wafer boat. Furthermore, the process chamber 102 comprises an outer section 114 and an inner section 116. In one embodiment of the invention, the inner section 116 can be a process tube. The batch processing system is capable of fast temperature ramping (lowering or raising) over a large temperature range. Temperature ramp rates may be a function of the difference between initial and final temperature. The temperature ramp rate may be as high as 50° C./min, for example when ramping the temperature over a large temperature range (e.g., ramping from 250° C. to 800° C.). However, the temperature ramp rate may be in the range of 5-20° C./min if the difference between initial and final temperature is relatively small (e.g., ramping from 250° C. to 300° C.), in order to avoid overshooting the final temperature.

The gas injection system 104 can introduce gases into the process chamber 102 for purging the process chamber 102, and for preparing, cleaning, and processing the substrates 110. The gas injection system 104 can, for example, include a liquid delivery system (LDS) (not shown) that contains a vaporizer to vaporize a precursor liquid. The vaporized liquid can be flowed into the process chamber 102 with or without the aid of a carrier gas. For example, when a carrier gas is used, the gas injection system can include a bubbling system where the carrier gas is bubbled through a reservoir containing the precursor liquid.

For example, embodiments of the invention may utilize a wide variety of hafnium and zirconium precursors for forming hafnium(Hf)- or zirconium(Zr)-containing films. For example, representative examples include: $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), $Hf(NMe_2)_4$ (tetrakis(dimethylamido)hafnium, TDMAH), $Zr(O^tBu)_4$ (zirconium tert-butoxide, ZTB), $Zr(NEt_2)_4$ (tetrakis(diethylamido) zirconium, TDEAZ), $Zr(NMeEt)_4$ (tetrakis (ethylmethylamido)zirconium, TEMAZ), $Zr(NMe_2)_4$ (tetrakis(dimethylamido)zirconium, TDMAZ), $ZrCp_2Me_2$, $Zr(^tBuCp)_2Me_2$, and $Zr(N^iPr_2)_4$.

Other embodiments may utilize a wide variety of tantalum, titanium, and aluminum precursors for forming tantalum (Ta)-, titanium(Ti)-, or aluminum(Al)-containing films. Examples of Ta-containing precursors containing "Ta—N" intra-molecular bonds include, for example, TAIMATA, $Ta(NEt_2)_5$ (PDEAT), $Ta(NMe_2)_5$ (PDMAT), $Ta(NEtMe)_5$ (PEMAT), $(^tBuN)Ta(NMe_2)_3$ (TBTDMT), $(^tBuN)Ta(NEt_2)_3$ (TBTDET), $(^tBuN)Ta(NEtMe)_3$ (TBTEMT), and $(^iPrN)Ta(NEt_2)_3$ (IPTDET). Examples of Ta-containing precursors containing "Ta—C" intra-molecular bonds include, for example, $Ta(\eta^5-C_5H_5)_2H_3$, $Ta(CH_2)(CH_3)(\eta^5-C_5H_5)_2$, $Ta(\eta^3-C_3H_5)(\eta^5-C_5H_5)_2$, $Ta(CH_3)_3(\eta^5-C_5H_5)_2$, $Ta(CH_3)_4(\eta^5-C_5(CH_3)_5)$, or $Ta(\eta^5-C_5(CH_3)_5)_2H_3$.

Examples of Ti-containing precursors having "Ti—N" intra-molecular bonds include, for example, $Ti(NEt_2)_4$ (TDEAT), $Ti(NMeEt)_4$ (TEMAT), $Ti(NMe_2)_4$ (TDMAT). Examples of Ti-containing precursors containing "Ti—C" intra-molecular bonds include, for example, $Ti(COCH_3)(\eta^5-C_5H_5)_2Cl$, $Ti(\eta^5-C_5H_5)Cl_2$, $Ti(\eta^5-C_5H_5)Cl_3$, $Ti(\eta^5-C_5H_5)_2Cl_2$, $Ti(\eta^5-C_5(CH_3)_5)Cl_3$, $Ti(CH_3)(\eta^5-C_5H_5)_2Cl$, $Ti(\eta^5-C_9H_7)_2Cl_2$, $Ti((\eta^5-C_5(CH_3)_5)_2Cl$, $Ti((\eta^5-C_5(CH_3)_5)_2Cl_2$, $Ti(\eta^5-C_5H_5)_2Cl_2$, $Ti(\eta^5-C_5H_5)_2(CO)_2$, $Ti(CH_3)_3(\eta^5-C_5H_5)$, $Ti(CH_3)_2(\eta^5-C_5H_5)_2$, $Ti(CH_3)_4$, $Ti(\eta^5-C_5H_5)(\eta^7-C_7H_7)$, $Ti(\eta^5-C_5H_5)(\eta^8-C_8H_8)$, $Ti(C_5H_5)_2(\eta^5-C_5H_5)_2$, $Ti((C_5H_5)_2)_2(\eta-H)_2$, $Ti(\eta^5-C_5(CH_3)_5)_2$, $Ti(\eta^5-C_5(CH_3)_5)_2(H)_2$, and $Ti(CH_3)_2(\eta^5-C_5(CH_3)_5)_2$.

Examples of aluminum-containing precursors include, for example, $Al_2Me_6$, $Al_2Et_6$, $Al(CH_3COCHCOCH_3)_3$, $AlBr_3$, $AlI_3$, $Al(O^iPr)_3$, $[Al(NMe_2)_3]_2$, $Al(^iBu)_2Cl$, $Al(^iBu)_3$, $Al(^iBu)_2H$, $AlEt_2Cl$, and $Al(THD)_3$.

Embodiments of the inventions may utilize a wide variety of different rare earth precursors to form a high-k dielectric film. Examples of rare earth precursor are described in U.S. patent application Ser. No. 11/278,387, the entire content of which is hereby incorporated by reference. According to some embodiments of the invention, the high-k dielectric film can contain a rare earth metal as a metal oxide, a metal oxynitride, a metal silicate, or a metal silicon oxynitride, or a combination thereof.

In the above description, the following ligand notation is used: $^tBu$:tert-butyl, $^iBu$:iso-butyl, Et:ethyl, Me:methyl, Cp:cyclopentadienyl, $^iPr$:isopropyl, and THD: 2,2,6,6-tetramethyl-3,5-heptanedionate.

In addition, the gas injection system 104 can be configured for flowing a gaseous Si-containing gas (e.g., silane ($SiH_4$)), an oxidizer containing an oxygen-containing gas or an oxygen- and nitrogen-containing gas (e.g., $O_2$, $O_3$, $N_2O$, NO, or $H_2O$ vapor) into the process chamber 102. The oxidizer gas source (not shown) may include a water vapor generator (WVG) (not shown) that generates $H_2O$ vapor from $H_2$ gas and $O_2$ gas. One example of a WVG is a high-dilution pyrogenic torch developed by Tokyo Electron Ltd., Nirasaki, Yamanashi, Japan. The high-dilution pyrogenic torch combusts small flows of $H_2$ gas and $O_2$ gas to generate $H_2O$ vapor in the form of steam, external to the process chamber 102. Furthermore, the above-mentioned gas flows can, for example, contain an inert gas (e.g., a noble gas or $N_2$) and/or a hydrogen-containing gas. The hydrogen-containing gas can, for example, contain $H_2$. A plurality of gas supply lines can be arranged to flow gases into the process chamber 102. The gases can be introduced into volume 118, defined by the inner section 116, and exposed to substrates 110. Thereafter, the gases can flow into the volume 120, defined by the inner section 116 and the outer section 114, and exhausted from the process chamber 102 by the vacuum pumping system 106.

Substrates 110 can be loaded into the process chamber 102 and processed using substrate holder 112. The batch processing system 100 can allow for a large number of tightly stacked substrates 110 to be processed, thereby resulting in high substrate throughput. A substrate batch size can, for example, be about 100 substrates (wafers), or less. Alternately, the batch size can be about 25 substrates, or less. The process chamber 102 can, for example, process a substrate of any size, for example 200 mm substrates, 300 mm substrates, or even larger substrates. The substrates 110 can, for example, comprise semiconductor substrates (e.g. silicon or compound semiconductor), LCD substrates, and glass substrates.

The batch processing system 100 can be controlled by a controller 124 capable of generating control voltages sufficient to communicate and activate inputs of the batch processing system 100 as well as monitor outputs from the batch processing system 100. Moreover, the controller 124 can be coupled to and exchange information with process chamber 102, gas injection system 104, heater 122, process monitoring system 108, and vacuum pumping system 106. For example, a program stored in the memory of the controller 124 can be utilized to control the aforementioned components of the batch processing system 100 according to a stored process recipe.

Real-time process monitoring can be carried out using process monitoring system 108. In general, the process monitoring system 108 is a versatile monitoring system and can, for example, comprise a mass spectrometer (MS) or a Fourier Transform Infra-red (FTIR) spectrometer. The process monitoring system 108 can provide qualitative and quantitative analysis of the gaseous chemical species in the process environment. Process parameters that can be monitored include gas flows, gas pressure, ratios of gaseous species, and gas purities. These parameters can be correlated with prior process results and various physical properties of the deposited high-k dielectric film.

Figure 1B:
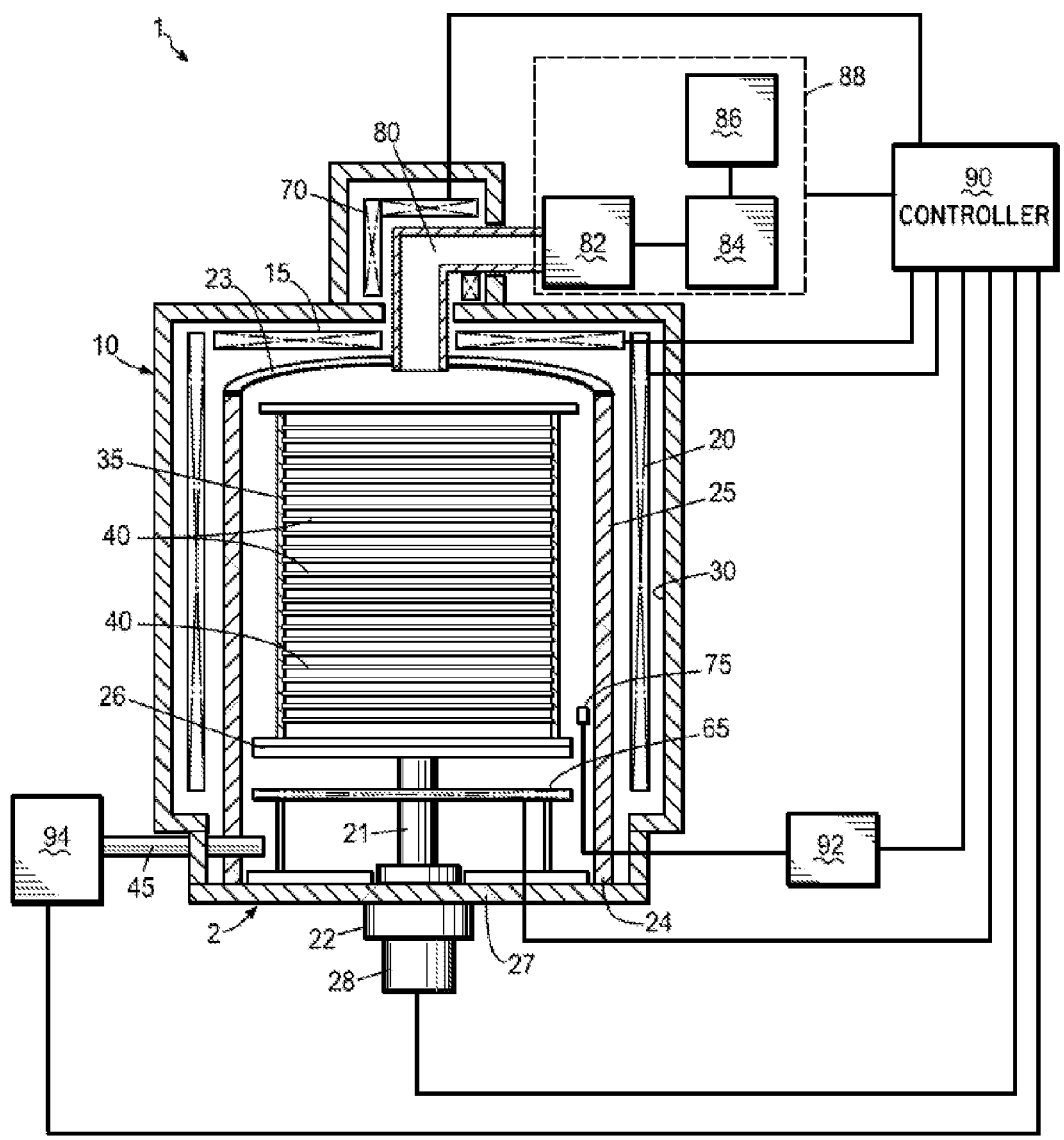
FIG. 1B shows a simplified block diagram of another batch processing system according to an embodiment of the invention.

FIG. 1B shows a simplified block diagram of another batch processing system for forming a high-k dielectric film on a substrate according to an embodiment of the invention. The batch processing system 1 contains a process chamber 10 and a process tube 25 that has an upper end 23 connected to a exhaust pipe 80, and a lower end hermetically joined to a lid 27 of cylindrical manifold 2. The exhaust pipe 80 discharges gases from the process tube 25 to a vacuum pumping system 88 to maintain a pre-determined atmospheric or below atmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternatively, the turntable can be stationary during processing. The lid 27 is mounted on an elevator 22 for transferring the substrate holder 35 in and out of the process tube 25. When the lid 27 is positioned at its uppermost position, the lid 27 is adapted to close the open end of the manifold 2.

A plurality of gas supply lines can be arranged around the manifold 2 to supply a plurality of gases into the process tube 25 through the gas supply lines. In FIG. 1B, only one gas supply line 45 among the plurality of gas supply lines is shown. The gas supply line 45 is connected to a gas injection system 94. A cylindrical heat reflector 30 is disposed so as to cover the process tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) is formed in the wall of the process chamber 10 as a cooling medium passage.

A vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas injection system 94 and the process chamber pressure can be adjusted by the APC 82. The trap 84 can collect unreacted precursor material and by-products from the process chamber 10.

The process monitoring system 92 comprises a sensor 75 capable of real-time process monitoring and can, for example, comprise a MS or a FTIR spectrometer. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas injection system 94, motor 28, process monitoring system 92, heaters 20, 15, 65, and 70, and vacuum pumping system 88.

Figures 2, 3:
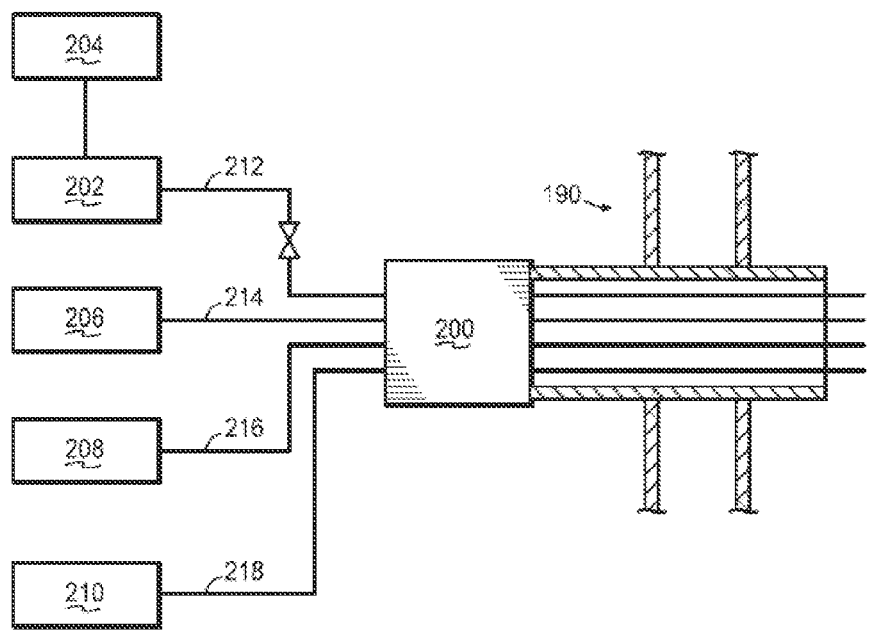
FIG. 2 shows a simplified block diagram of a gas injection system coupled to a process chamber according to an embodiment of the invention.
FIG. 3 depicts the chemical structures and formulas for hafnium tert-butoxide (HTB) and tetra-diethylamide hafnium (TDEAH)

FIG. 2 depicts a gas injection system 200 coupled to a process chamber 190, where the gas injection system 200 and process chamber 190 can be the gas injection system 104 and process chamber 102 in FIG. 1A or the gas injection system 94 and process chamber 10 in FIG. 1B. Gas injection system 200 can be coupled to a liquid delivery system (LDS) 202 that contains a vaporizer to vaporize a precursor liquid such as tert-butoxide (HTB) and tetra-diethylamide hafnium (TDEAH). FIG. 3 depicts the chemical structures and formulas for HTB or TDEAH. The vaporized liquid can be flowed through the gas injection system 200 into the process chamber 190 with or without the aid of a carrier gas. For example, when a carrier gas is used, a bubbling system 204 may be provided where the carrier gas is bubbled through a reservoir containing the precursor liquid. In addition, the gas injection system 200 can be coupled to a Si-containing gas source 206, e.g., $SiCl_4$, $SiH_4$, or $Si_2H_6$, to provide a Si-containing gas to the process chamber 190 to incorporate Si into the high-k dielectric film. Gas injection system 200 may also include an oxidizing gas source 208, for example a water vapor generator (WVG) or an ozone generator. Gas injection system 200 may also include a N-containing gas source 210, e.g., $NH_3$, to provide a N-containing gas to the process chamber to incorporate N into the high-k dielectric film. A plurality of gas supply lines 212, 214, 216, 218 can be arranged to flow the gases into the process chamber 190.

Figure 4:
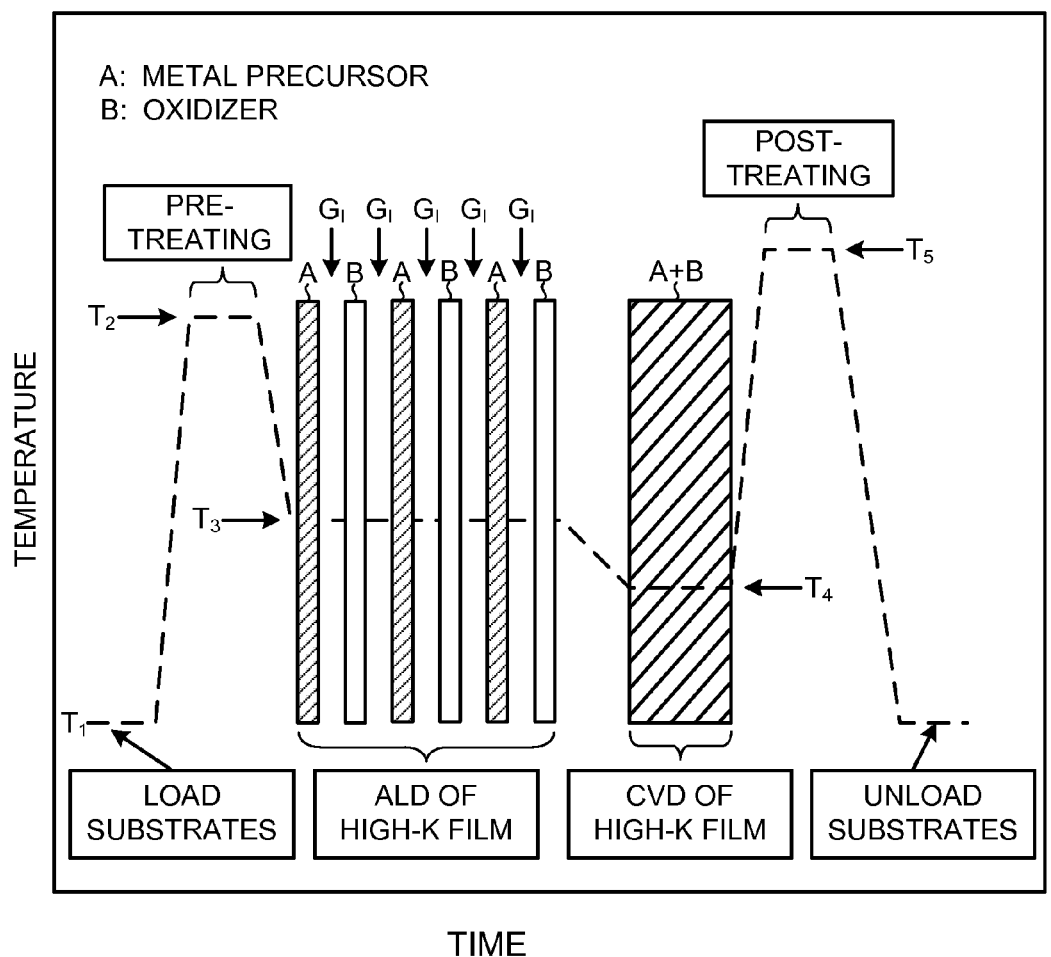
FIG. 4 graphically depicts a timeline for in-situ hybrid deposition of a high-k dielectric film using a combination of ALD and CVD according to an embodiment of the invention.

FIG. 4 graphically depicts a timeline for in-situ hybrid deposition of a high-k dielectric film using a combination of ALD and CVD according to an embodiment of the invention and FIGS. 5A-5E show a schematic cross-sectional representation of a process flow for an in-situ hybrid deposition of a high-k dielectric film on a substrate according to an embodiment of the invention. The timeline shows an optional pre-treating of a substrate, deposition of a first portion of a high-k dielectric film on the substrate, deposition of a second portion of the high-k dielectric film on the first portion by CVD to form the high-k dielectric film, and an optional post-treating of the high-k dielectric film. According to embodiments of the invention, the pre-treating, the post-treating, or both the pre-treating and the post-treating are may be omitted from the overall in-situ hybrid deposition process depicted in FIG. 4 and FIGS. 5A-5E. According to embodiments of the invention, the process steps shown in FIG. 4 (i.e., pre-treating, ALD, CVD, and post-treating) may be performed in-situ, i.e., in the same process chamber without removing the substrate from the process chamber.

The in-situ hybrid high-k dielectric film deposition process includes providing plurality of substrates to be processed, for example 25 or 50 substrates, on a substrate holder in a process chamber of a batch processing system maintained at a temperature $T_1$. In the case of hot-wall process chambers, for example the process chamber 102 in FIG. 1A or the process chamber 10 in FIG. 1B, in which cases the process chamber temperature will be at or near the substrate temperature. Following loading of the plurality of substrates into the process chamber, the process chamber is evacuated and optionally purged with an inert gas.

The in-situ hybrid high-k dielectric film deposition process can save time on loading and removing substrates since the substrates only need to be loaded once prior to pre-treating and removed from the process chamber once after post-treating. In addition, the process saves time on temperature ramping, since the substrates do not need be cooled down to a transfer temperature between steps. Finally, the process saves time on substrate transport by eliminating the transport steps between each process step. In addition to the time-savings, the process reduces opportunities for contamination of the high-k dielectric film and contamination of an interface layer between the substrate and the high-k dielectric film.

Figure 5A:
FIGS. 5A-5E show a schematic cross-sectional representation of a process flow for an in-situ hybrid deposition of a high-k dielectric film on a substrate according to an embodiment of the invention.
Figure 5B:
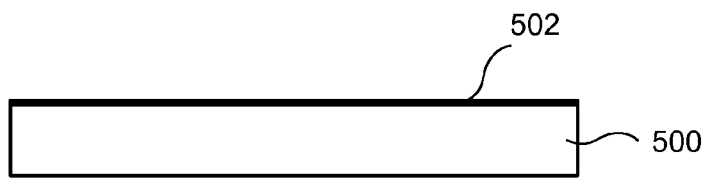

According to one embodiment of the invention, a pre-treating of the substrates may be performed prior to depositing a high-k dielectric film on the substrates. The pre-treating may be performed to remove impurities from a surface of the substrate 500 depicted in FIG. 5A and subsequently form an oxide or oxynitride interface layer 502 on the substrate 500 as depicted in FIG. 5B. A thickness of the interface layer 502 can be, for example, between about 0.4 nm and about 2 nm, or between about 0.8 nm and about 1.5 nm. According to another embodiment, the oxide or oxynitride interface layer 502 may be present on the substrate 500 when the substrate 500 is loaded into the process chamber. According to another embodiment, the interface layer 502 may be absent from the substrate 500. The pre-treating can include ramping the substrate temperature from $T_1$ (e.g., approximately room temperature) to $T_2$ and exposing the substrate 500 to a gaseous oxidizer for a pre-determined amount of time at $T_2$. By way of example and not limitation, the pre-treating may be performed for about 30 seconds up to about 30 minutes, or between about 5 minutes and about 20 minutes, for example about 10 minutes. For example, the oxidizer (oxygen-containing gas or oxygen- and nitrogen-containing gas) can include $O_2$, $O_3$, $N_2O$, $NO$, or $H_2O$, or a combination thereof. The oxidizer may further contain an inert gas such as Ar or nitrogen $N_2$. In an exemplary embodiment, a water vapor generator (WVG) may be used to generate water vapor ($H_2O$) and deliver (or pulse) it to the process chamber.

In one embodiment, the substrate temperature $T_2$ can be between about 200° C. and about 1000° C. during the pre-treating, between about 400° C. and about 900° C., or between about 500° C. and about 850° C. In an exemplary embodiment, the chamber pressure can be in between about 0.01 mTorr and about 100 Torr, for example between about 0.1 Torr and about 10 Torr. One exemplary pre-treating includes exposing the substrate 500 to NO at a substrate temperature $T_2$ between about 700° C. and about 800° C. A flow rate for the NO oxidizer may be up to about 20 slm, for example about 0.1-5 slm.

Figure 5C:
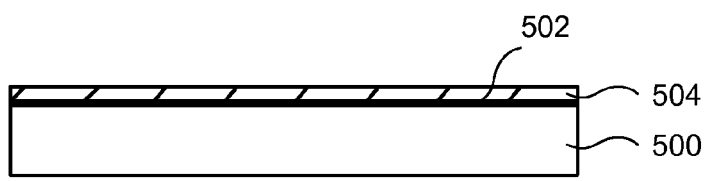

According to one embodiment of the invention, following the optional pre-treating, the substrate temperature is ramped from $T_2$ to $T_3$ and a first portion 504 of a high-k dielectric film depicted in FIG. 5C is deposited on the interface layer 502 by ALD. According to another embodiment, the first portion 504 may be directly deposited on the substrate 500, for example when a pre-treating is omitted. In the exemplary embodiment depicted in FIG. 4, $T_3$ is lower than $T_2$. In alternate embodiments, $T_3$ may be equal to $T_2$, or $T_3$ make be higher than $T_2$. The ALD may be carried out under same or similar temperature and pressure conditions as the optional pre-treating step described above. A thickness of the first portion 504 of the high-k dielectric film can, for example, be between 0.5 nm and about 5 nm. The ALD provides a relatively slow growth rate of the conformal first portion 504 with excellent interface properties with the underlying interface layer 502 or substrate 500

ALD has demonstrated an outstanding ability to maintain ultra-uniform thin deposition film on flat surfaces or over complex surface topology. This is at least partially because ALD is not as flux dependent as is CVD processing. The technique of ALD is based on the principle of the formation of a saturated monolayer or sub-monolayer of reactive precursor molecules (metal precursor) by chemisorption. Still referring to FIG. 4, a typical ALD cycle for forming an AB layer includes flowing a precursor or reactant A into a process chamber for a period of time in which a saturated monolayer of A is formed on the substrate. Then, the flow of precursor or reactant A is stopped and the precursor or reactant A is evacuated and/or purged from the process chamber using an inert gas, $G_I$. This is followed by flowing precursor or reactant B into the process chamber, also for a period of time, to combine B with A thus forming the layer AB on the substrate. Then, the flow of precursor or reactant B is stopped and the precursor or reactant B is evacuated and/or purged from the process chamber using inert gas, $G_I$. This process of introducing precursor or reactant A, purging the process chamber, introducing precursor or reactant B, and purging the process chamber can be repeated a number of times to achieve an AB film (i.e., first portion 504 of the high-k dielectric film) of a desired thickness. The number of cycles, the flow rates, and exposure times may be dependent, at least in part, upon the desired AB film thickness. The evacuation and/or purge times are dependent on the process chamber volume and design, and chemicals used as well as the process pressure and gas flow rates.

By way of example only, the ALD may include about 5-50 cycles of alternating pulsing of an oxidizer (e.g., $O_2$ or $H_2O$) and a metal precursor (e.g., TDEAH), for example about 10-25 cycles. The exposure (or pulsing) time for the oxidizer and the metal precursor may each be in the range of about 5 seconds to about 5 minutes, for example about 15 seconds to about 2 minutes. In an exemplary embodiment for forming a $HfO_2$ film, the oxidizer may be pulsed for twice as long as the hafnium precursor. The evacuation times and/or purge times may be any desired time for removing excess reactant from the chamber, for example, about 10 seconds to about 5 minutes, and by way of further example, about 30 seconds to about 2 minutes.

Figure 5D:
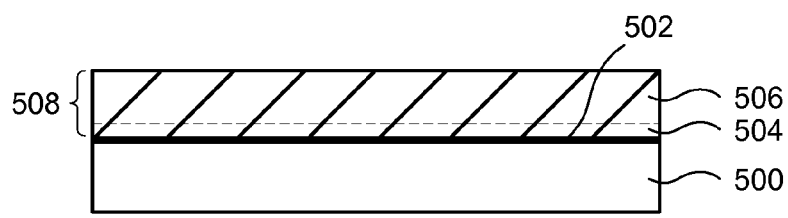

Following deposition of the first portion 504 of the high-k dielectric film on the substrate 500 by ALD, the substrate temperature is lowered from $T_3$ to $T_4$ and a second portion 506 of the high-k dielectric film 508 depicted in FIG. 5D is deposited by CVD processing on the first portion 504 at a substrate temperature $T_4$. The first and second portions 504 and 506 form high-k dielectric film 508. In the CVD processing, precursors or reactants A and B are both flowed into the process chamber for a time period selected for depositing the second portion 506 with a desired thickness. A thickness of the second portion 506 can, for example, be between 1 nm and about 100 nm. In the exemplary embodiment depicted in FIG. 4, $T_4$ is lower than $T_3$. In alternate embodiments, $T_4$ may be equal to $T_3$, or $T_4$ make be higher than $T_3$. The CVD processing may be carried out under same or similar temperature and pressure conditions as the ALD described above.

The CVD provides a high growth rate of the second portion 506 on the first portion 504 of the high-k dielectric film 508. Thus, the in-situ hybrid high-k dielectric deposition process combines superior conformality and interface properties of the first portion 504 deposited by ALD and high deposition rates of the second portion 506 deposited by CVD. This enables cost-effective formation of a wide variety of high-quality high-k dielectric films found or proposed in advanced semiconductor devices. A total thickness of the high-k dielectric film 508 may be chosen by independently selecting a thickness of the first portion 504 and a thickness of the second portion 506. The thickness of the first portion 504 is a function of the total number of ALD cycles and a thickness of the second portion 506 is a function of the total exposure time of the oxidizer and the metal precursor.

According to embodiments of the invention, the in-situ hybrid high-k dielectric deposition process may include performing ALD using a first set of process conditions (e.g., ALD substrate temperature, ALD gas pressure, and ALD gas flows), adjusting the process conditions to a second set of process conditions (e.g., CVD substrate temperature, CVD gas pressure, and CVD gas flows), and performing CVD using the second set of process conditions. The batch processing system is configured for providing rapid adjustment of the processing conditions.

Figure 5E:
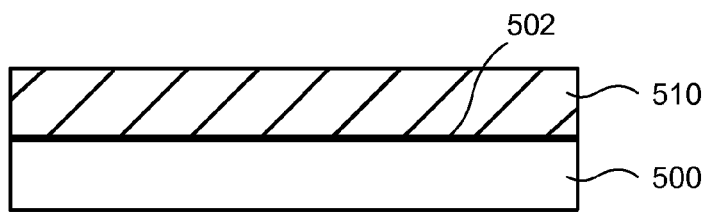

Following deposition of the second portion 506, an optional post-treating of the high-k dielectric film 508 may be performed at a substrate temperature $T_5$ to form modified high-k dielectric film 510 depicted in FIG. 5E. In the exemplary embodiment depicted in FIG. 4, $T_5$ is higher than $T_4$. In alternate embodiments, $T_5$ may be equal to $T_4$, or $T_5$ may be lower than $T_4$. The post-treating can densify the high-k dielectric film 508, remove unreacted reactants from the high-k dielectric film 508, further oxidize the interface layer 502, or fill oxygen vacancies and or redistribute substitutional oxygen in the high-k dielectric film 508. The post-treating may include (a) a high temperature anneal at a substrate temperature between about 500° C. and about 1000° C. with no gaseous environment (i.e., high vacuum condition), (b) a high temperature oxidation at substrate temperature between about 500° C. and about 1000° C. in the presence of a fourth oxidizer selected from an oxygen-containing gas or an oxygen- and nitrogen-containing gas, or (c) a high temperature anneal at a substrate temperature between about 500° C. and about 1000° C. in the presence of a non-oxidizing gas (e.g., an inert gas such as argon (Ar) or nitrogen ($N_2$)).

The post-treating may be performed under same or similar conditions as the pre-treating, but this is not required as other processing conditions may be utilized. The post-treating can include ramping the substrate temperature from $T_4$ to $T_5$ and performing the post-treating for a pre-determined amount of time at $T_5$. In one example, the post-treating may include exposure to an inert gas for a first time period, followed by exposure to an oxidizer for a second time period. In another example, the post-treating may include exposure to an oxidizer for a first time period, followed by exposure to an inert gas for a second time period. By way of example and not limitation, the pre-treating may be performed for about 30 seconds up to about 30 minutes, or between about 5 minutes and about 20 minutes, for example about 10 minutes. The oxidizer can include $O_2$, $O_3$, $N_2O$, NO, or $H_2O$, or a combination thereof. In one embodiment, the substrate temperature can be between about 200° C. and about 1000° C. during the post-treating, between about 400° C. and about 900° C., or between about 500° C. and about 850° C. In an exemplary embodiment, the chamber pressure can be in between about 0.01 mTorr and about 100 Torr, for example between about 0.1 and about 10 Torr. One exemplary post-treating includes exposing the high-k dielectric film 508 to NO at a temperature between about 700° C. and about 800° C.

According to other embodiments of the invention, the post-treating may be performed after deposition of the first portion 504 and before deposition of the second portion 506.

According to embodiments of the invention, the temperatures $T_1$-$T_5$ may have any value between 200° C. and 1000° C., but higher and lower temperatures may also be selected. Although frequent temperature ramping may be required between ALD and CVD, in addition to any optional pre-treating and/or post-treating, the fast temperature ramping capabilities and short temperature stabilization periods can attain high substrate throughput. The pressure in the process chamber may be the same or similar throughout the optional pre-treating, the ALD, the CVD, and the optional post-treating. Alternatively, the pressure may vary.

Figure 6A:
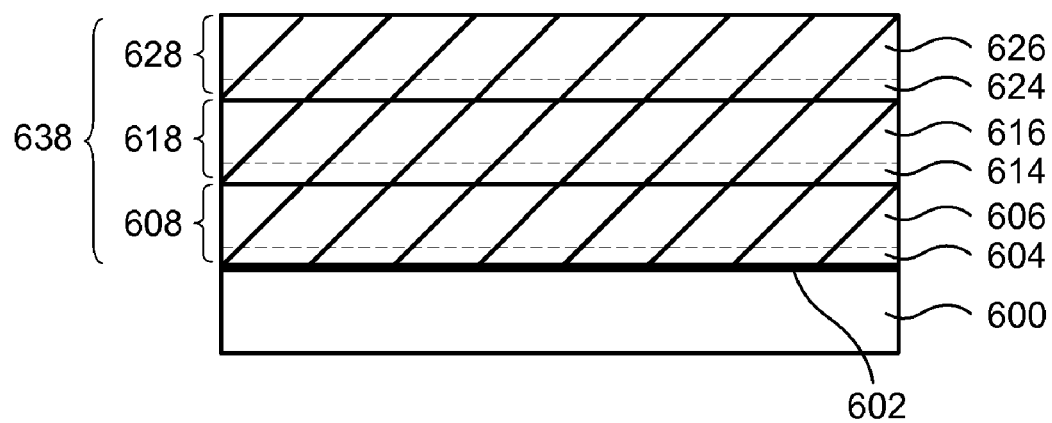
FIGS. 6A and 6B show schematic cross-sectional representations of additional high-k dielectric films deposited on substrates according to embodiments of the invention.
Figure 6B:
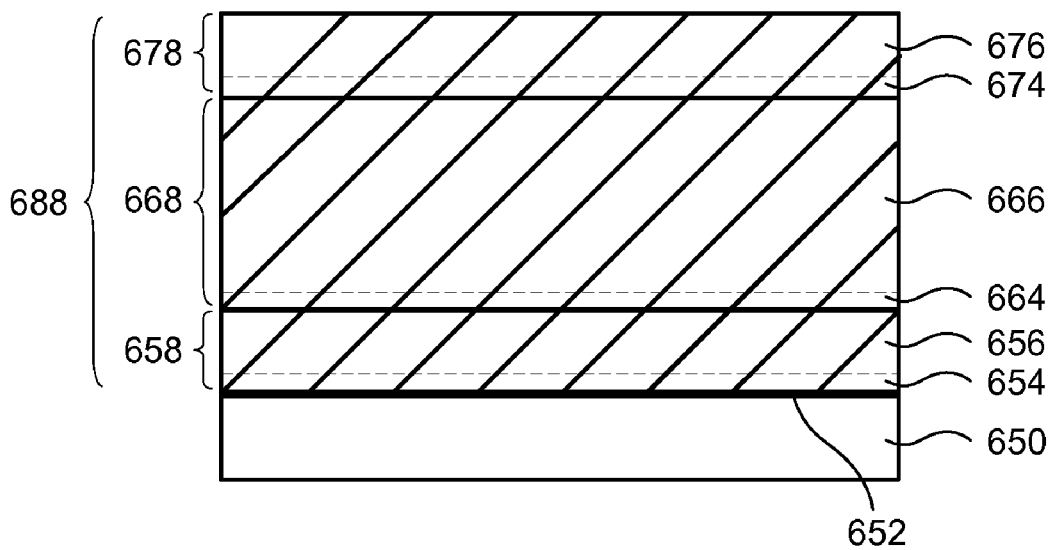

FIGS. 6A and 6B show schematic cross-sectional representations of additional high-k dielectric films deposited on substrates according to embodiments of the invention. According to embodiments of the invention, the alternating ALD and CVD may be repeated any number of times to better control the conformality and electrical film properties of the resulting high-k dielectric film. In one example, a plurality of first film portions deposited by ALD may be interspersed at substantially equal intervals in a relatively thick second film portions deposited by CVD.

FIG. 6A shows an exemplary high-k dielectric film 638 on an interface layer 602 overlying a substrate 600. The high-k dielectric film 638 contains first, second, and third high-k dielectric films 608, 618, and 628, respectively. First high-k dielectric film 608 contains a first portion 604 deposited by ALD and a second portion 606 deposited by CVD. Similarly, the second and third high-k dielectric films 618,628 contain first portions 614, 624 deposited by ALD and second portions 616, 626 deposited by CVD. As schematically depicted in FIG. 6A, the first portions 604,614,624 have the same or substantially the same thickness and are interspersed in the high-k dielectric film 638 at substantially equal intervals. As those skilled in the art will readily appreciate, the hybrid high-k dielectric film deposition process is not limited to three high-k dielectric films as depicted in FIG. 6A, as any number of high-k dielectric films may be deposited. In one example, a 40 nm thick high-k dielectric film may be deposited using 8 deposition sequences, where each deposition sequence deposits a high-k dielectric film with a thickness of 1 nm by ALD and deposits a high-k dielectric film with a thickness of 4 nm by CVD.

Similarly, FIG. 6B shows another exemplary high-k dielectric film 688 on an interface layer 652 overlying a substrate 650. The high-k dielectric film 688 contains first, second, and third high-k dielectric films 658,668, and 678, respectively. First high-k dielectric film 658 contains a first portion 654 deposited by ALD and a second portion 656 deposited by CVD. Similarly, the second and third high-k dielectric films 668,678 contain first portions 664, 674 deposited by ALD and second portions 666, 676 deposited by CVD. As schematically depicted in FIG. 6B, the first portions 654,664, and 674 have the same or substantially the same thickness but the second high-k dielectric film 668 has a substantially thicker second (CVD) portion 666 than the corresponding first (CVD) portions 656,676 in the first and third high-k dielectric films 658,678, respectively.

In view of FIGS. 6A and 6B, those skilled in the art will readily appreciate that the hybrid high-k dielectric film deposition process may be utilized for depositing a wide variety of different high-k dielectric films containing any number of first and second portions, where the first and second portions can each have any desired thickness. As those skilled in the art will readily appreciate, the hybrid high-k dielectric film deposition process is not limited to three high-k dielectric films as depicted in FIG. 6B, as any number of high-k dielectric films may be deposited with any thickness.

Still referring to FIGS. 6A and 6B, a benefit of depositing a portion of a high-k dielectric film by ALD can include blocking or breaking up film defects that may significantly contribute to the increase in leakage current of the entire high-k dielectric films 638 and 688. Therefore, the electrical properties of the high-k dielectric films 638 and 688 may be improved with careful use of ALD, while the bulk of the high-k dielectric films 638 and 688 may be deposited using the more economical CVD.

Still referring to FIGS. 6A and 6B, according to embodiments of the invention, the post-treating described in reference to FIGS. 5A-5E may also be performed after deposition of the first portions 604,614 and 624 and before deposition of the second portions 606,616 and 626, respectively. In other words, in one example, the first portion 604 may be post-treated before deposition of the second portion 606. Similarly, the post-treating may be performed after deposition of the first portions 654,664 and 674 and before deposition of the second portions 656,666 and 676, respectively Table 1 shows results for deposition of a $HfO_2$ film on a substrate in a batch processing system by CVD, ALD, and ALD followed by CVD. Table 1 shows deposition method (including type of oxidizer), substrate temperature, total run (deposition) time, EOT, dielectric constant (k), flat band voltage shift ($\Delta V_{fb}$), interface state density ($D_{it}$), and leakage current density ($J_L$) at −2 Volts, −6 Volts, and −8 Volts. The ALD used alternating exposures of $H_2O$ oxidizer and TDEAH hafnium precursor at substrate temperatures of 275° C. and 300° C., where the alternating exposures were separated by evacuation and purging steps. The 275° C. ALD process included 160 cycles and the 300° C. ALD process included 65 cycles. Each ALD cycle included $H_2O$ oxidizer exposure time of 30 seconds and TDEAH exposure time 90 seconds. Each ALD cycle further included a 1 minute gas purge, followed by a 1 minute evacuation, after each $H_2O$ oxidizer exposure and TDEAH exposure. The process chamber pressure was 0.3 Torr during the ALD processes. The $H_2O$ oxidizer was generated in a water vapor generator using a gas flow rate of 0.1 standard liters per minute (slm) of $H_2$ and 0.1 slm of $O_2$. The alternating exposures were carried out until the desired physical thickness of the $HfO_2$ film was achieved. The CVD used simultaneous exposures of $O_2$ oxidizer and TDEAH at substrate temperatures of 235° C. and 250° C. The process chamber pressure was 0.3 Torr during the CVD processes. The $O_2$ oxidizer gas flow rate was 0.5 slm, and the TDEAH exposure included a gas flow rate of 1.25 slm of $N_2$ carrier gas into a TDEAH vaporizer with 0.1 cubic centimeter (cc)/min of TDEAH liquid concurrently delivered to the vaporizer.

As seen in Table 1, deposition of the high-k dielectric films by ALD was significantly slower than the deposition by CVD. This is due, at least in part, to the separation required for the reactant gases $H_2O$ and TDEAH, and the purge gas, in ALD. However, ALD is often used or preferred over CVD because of the ability of ALD to deposit thin films with uniform thickness in deep trenches and on structures with complex surface topography compared to CVD. Furthermore, high-k dielectric films deposited by ALD often exhibit superior electrical properties due, at least in part, lower film defects. Comparison of the film properties shown in Table 1 for ALD and CVD shows that the $HfO_2$ films deposited by ALD resulted in higher dielectric constants (k), lower hysteresis ($\Delta V_{fb}$), lower interface state density ($D_{it}$), and lower leakage current densities than the $HfO_2$ films deposited by CVD. However, the CVD provided much shorter deposition times than the ALD, even when using lower substrate temperatures than the ALD.

Table 1 further shows the results of an in-situ hybrid $HfO_2$ deposition process according to an embodiment of the invention. The in-situ hybrid deposition process included sequential deposition of a $HfO_2$ film by ALD and CVD. The ALD used alternating exposures of a $H_2O$ oxidizer and a TDEAH hafnium precursor at a substrate temperature of 275° C., separated by evacuation and purging steps. The ALD process included 70 cycles and the ALD process was followed by a 40 min CVD process. The ALD and CVD processing conditions have been described above. Next, the temperature was ramped from 275° C. to 235° C. at a rate of 5° C./min. The CVD processing used simultaneous exposures of the $O_2$ oxidizer and the TDEAH hafnium precursor at substrate temperature of 235° C.

As seen in Table 1, the hybrid in-situ $HfO_2$ deposition process provides the compromise of shorter run time compared to ALD alone and $HfO_2$ film electrical properties that are improved over CVD alone.

A plurality of embodiments for depositing a high-k dielectric film on a plurality of substrates in a batch processing system for high-volume semiconductor manufacturing has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An in-situ hybrid film deposition method, comprising:
   loading a plurality of substrates into a process chamber of a batch processing system;
   depositing a first portion of a high-k dielectric film on the plurality of substrates by atomic layer deposition (ALD);
   after depositing the first portion, and without removing the plurality of substrates from the process chamber, depositing a second portion of the high-k dielectric film on the first portion by chemical vapor deposition (CVD);
   prior to removing the plurality of substrates from the process chamber, post-treating the first portion or the second portion of the high-k dielectric film, wherein the post-treating is selected from one or any sequential combination of:
   (a) a high temperature anneal at a substrate temperature between about 500° C. and about 1000° C. with no gaseous environment;
   (b) a high temperature oxidation at substrate temperature between about 500° C. and about 1000° C. in the presence of a fourth oxidizer selected from an oxygen-containing gas or an oxygen- and nitrogen-containing gas; or
   (c) a high temperature anneal at a substrate temperature between about 500° C. and about 1000° C. in the presence of a non-oxidizing gas; and
   removing the plurality of substrates from the process chamber.

2. The method of claim 1, further comprising:
   prior to the deposition of the first portion, pre-treating the plurality of substrates in the process chamber with a first oxidizer selected from an oxygen-containing gas or an oxygen- and nitrogen-containing gas at a substrate temperature between 100° C. and 1000° C.

3. The method of claim 2, wherein the pre-treating is performed at higher substrate temperatures than the deposition of the first and second portions.

TABLE 1

| Deposition Method (Oxidizer) | Substrate Temperature (° C.) | Film Thickness (Å) | Total Run Time (hrs) | EOT (Å) | Dielectric Const. (k) | $\Delta V_{fb}$ (mV) | $D_{it}$ ($10^{+11}$ eV/cm$^2$) | $J_L$ (Amps/cm$^2$) at -2 Volts | at -6 Volts | at -8 Volts |
|---|---|---|---|---|---|---|---|---|---|---|
| CVD ($O_2$) | 250 | 337.7 | 2.6 | 99.6 | 13.2 | 227 | 3.7 | $1.5 \times 10^{-6}$ | $5.5 \times 10^{-5}$ | $1.3 \times 10^{-4}$ |
| CVD ($O_2$) | 235 | 337 | 3.0 | 105.4 | 12.5 | 238 | 3.4 | $1.3 \times 10^{-6}$ | $4.8 \times 10^{-5}$ | $1.1 \times 10^{-4}$ |
| ALD ($H_2O$) | 275 | 372.1 | 20.5 | 105.9 | 13.7 | 42 | 2.7 | $1.4 \times 10^{-8}$ | $4.7 \times 10^{-8}$ | $1.1 \times 10^{-7}$ |
| ALD ($H_2O$) | 300 | 303 | 9.6 | 80 | 14.7 | 174 | 3.8 | $2.9 \times 10^{-7}$ | $9.6 \times 10^{-6}$ | $2.2 \times 10^{-5}$ |
| ALD/CVD ($H_2O/O_2$) | 275/235 | 302 | 10.4 | 84.6 | 13.9 | 203 | 3.1 | $1.6 \times 10^{-7}$ | $7.9 \times 10^{-6}$ | $4.0 \times 10^{-5}$ |

4. The method of claim 2, wherein the first oxidizer is selected from $O_2$, $O_3$, $N_2O$, NO, or $H_2O$ vapor, or a combination thereof.

5. The method of claim 1, wherein depositing the first portion comprises:
performing a plurality of deposition cycles, each cycle comprising alternating exposures of the plurality of substrates in the process chamber to a second oxidizer and a metal precursor with optional purging in-between, wherein the second oxidizer is selected from an oxygen-containing gas or an oxygen- and nitrogen-containing gas.

6. The method of claim 5, wherein the second oxidizer is selected from $O_2$, $O_3$, $N_2O$, NO, or $H_2O$ vapor, or a combination thereof.

7. The method of claim 1, wherein the deposition of the second portion comprises:
simultaneously exposing the plurality of substrates in the process chamber to a third oxidizer and a metal precursor, wherein the third oxidizer is selected from an oxygen-containing gas or an oxygen- and nitrogen-containing gas.

8. The method of claim 7, wherein the third oxidizer is selected from $O_2$, $O_3$, $N_2O$, NO, or $H_2O$ vapor, or a combination thereof.

9. The method of claim 1, wherein the post-treating is performed at a higher substrate temperature than the deposition of the first and second portions.

10. The method of claim 1, wherein the fourth oxidizer is selected from $O_2$, $O_3$, $N_2O$, NO, or $H_2O$ vapor, or a combination thereof.

11. The method of claim 1, further comprising:
alternatingly repeating the deposition of the first and second portions, wherein each first portion has a first thickness and each second portion has a second thickness.

12. The method of claim 11, wherein each of the first portions, each of the second portions, or each of the first and second portions have substantially the same thickness.

13. The method of claim 11, wherein at least one of the second portions has a first thickness that is smaller or greater than the other second portions.

14. The method of claim 1, wherein the deposition of the first and the second portions is performed at substantially the same substrate temperature.

15. The method of claim 1, wherein the deposition of the first and second portions is performed at different substrate temperatures.

16. An in-situ hybrid film deposition method, comprising:
loading a plurality of substrates into a process chamber of a batch processing system;
depositing a first portion of a high-k dielectric film on the plurality of substrates by atomic layer deposition (ALD);
after depositing the first portion, and without removing the plurality of substrates from the process chamber, depositing a second portion of the high-k dielectric film on the first portion by chemical vapor deposition (CVD); and
removing the plurality of substrates from the process chamber, wherein the deposition of the first portion utilizes a second oxidizer, depositing the second portion utilizes a third oxidizer that is different than the second oxidizer, and each of the second and third oxidizers are selected from $O_2$, $O_3$, $N_2O$, NO, or $H_2O$ vapor, or a combination thereof.

17. An in-situ hybrid film deposition method, comprising:
loading a plurality of substrates into a process chamber of a batch processing system;
pre-treating the plurality of substrates in the process chamber with a first oxidizer at a substrate temperature between 500° C. and 1000° C.;
following the pre-treating, depositing a first portion of a $HfO_2$ film on the plurality of substrates by atomic layer deposition (ALD), wherein the depositing a first portion includes performing a plurality of deposition cycles, each cycle comprising alternating exposure of the plurality of substrates in the process chamber to a second oxidizer and a metal precursor with optional purging in-between;
depositing a second portion of the $HfO_2$ film on the first portion by chemical vapor deposition (CVD), wherein the depositing by CVD includes simultaneously exposing the plurality of substrates to a third oxidizer and the metal precursor;
post-treating the plurality of substrates containing the $HfO_2$ film by performing a high temperature oxidation anneal at a substrate temperature between about 500° C. and about 1000° C. in the presence of a fourth oxidizer, wherein the first, second, third, and fourth oxidizers are each selected from $O_2$, $O_3$, $N_2O$, NO, or $H_2O$ vapor, or a combination thereof, and wherein the pre-treating, depositing the first portion, depositing the second portion, and the post-treating are performed without removing the plurality of substrates from the process chamber; and
removing the plurality of substrates from the process chamber.

18. The method of claim 17, wherein the pre-treating and post-treating are performed at higher substrate temperatures than the deposition of the first and second portions.

19. The method of claim 17, wherein the deposition of the first and second portions is performed at different substrate temperatures.

* * * * *